United States Patent [19]

Schroeder

[11] Patent Number: 4,475,810
[45] Date of Patent: Oct. 9, 1984

[54] DOCKING SENSOR SYSTEM

[75] Inventor: Richard B. Schroeder, Wilmington, Del.

[73] Assignee: Hercules Incorporated, Wilmington, Del.

[21] Appl. No.: 194,114

[22] Filed: Oct. 6, 1980

[51] Int. Cl.³ .............................................. G03B 27/04
[52] U.S. Cl. ........................................ 355/85; 355/78; 264/299; 430/30
[58] Field of Search .............. 118/669, 677, 679, 692, 118/693; 355/78, 85, 113; 264/299

[56] References Cited

U.S. PATENT DOCUMENTS

| | | | |
|---|---|---|---|
| 3,479,952 | 11/1969 | Bernardi et al. | 264/299 |
| 3,520,606 | 7/1970 | Gush et al. | 96/35.1 |
| 3,556,791 | 1/1971 | Suzski | 96/35.1 |
| 3,605,689 | 9/1971 | Sherwood | 118/407 |
| 3,628,963 | 2/1971 | Akamatsu | 96/115 |
| 3,635,711 | 1/1972 | Miller et al. | 96/35.1 |
| 3,639,056 | 2/1972 | Gerson | 355/40 |
| 3,661,575 | 5/1972 | Ketley et al. | 96/35.1 |
| 3,663,222 | 5/1972 | Akamatsu et al. | 96/35.1 |
| 3,687,785 | 8/1972 | Akamatsu et al. | 156/501 |
| 3,729,256 | 4/1973 | Westfall et al. | 355/18 |
| 3,751,164 | 8/1973 | Miller et al. | 355/100 |
| 3,782,327 | 1/1974 | Wessells et al. | 118/100 |
| 3,794,494 | 2/1974 | Kai et al. | 96/35.1 |
| 3,832,177 | 8/1973 | Akamatsu et al. | 96/35.1 |
| 3,837,887 | 9/1974 | Akamatsu et al. | 117/34 |
| 3,848,998 | 11/1974 | Yonekura et al. | 355/100 |
| 3,858,510 | 1/1975 | Kai et al. | 101/395 |
| 3,957,015 | 5/1976 | Harris | 118/100 |
| 3,960,572 | 6/1976 | Ibata et al. | 96/115 P |
| 3,971,691 | 7/1976 | Cairns | 156/497 |
| 4,056,423 | 10/1977 | Hughes | 156/356 |
| 4,214,942 | 7/1980 | Inoko et al. | 156/500 |

Primary Examiner—John D. Welsh
Attorney, Agent, or Firm—Marion C. Staves

[57] ABSTRACT

An improved apparatus for the preparation of photopolymerized relief image plates is disclosed in which a series of indicators are used to indicate that the liquid photopolymerizable material is prepared for exposure to actinic radiation. Such detection may be accomplished by the closure of electrically energized indicator circuits used to detect when a top cover is in position over a layer of liquid photopolymerizable material. In addition, the actinic radiation may be activated directly by the closure of such circuits. Also disclosed is a method by which the time required for the top cover to come to rest in position over the photopolymerizable layer can be measured, and this measurement may then be used as a control to determine if a sufficient amount of photopolymerizable material to make an acceptable relief image plate was deposited on the platemaking surface.

3 Claims, 1 Drawing Figure

U.S. Patent     Oct. 9, 1984     4,475,810
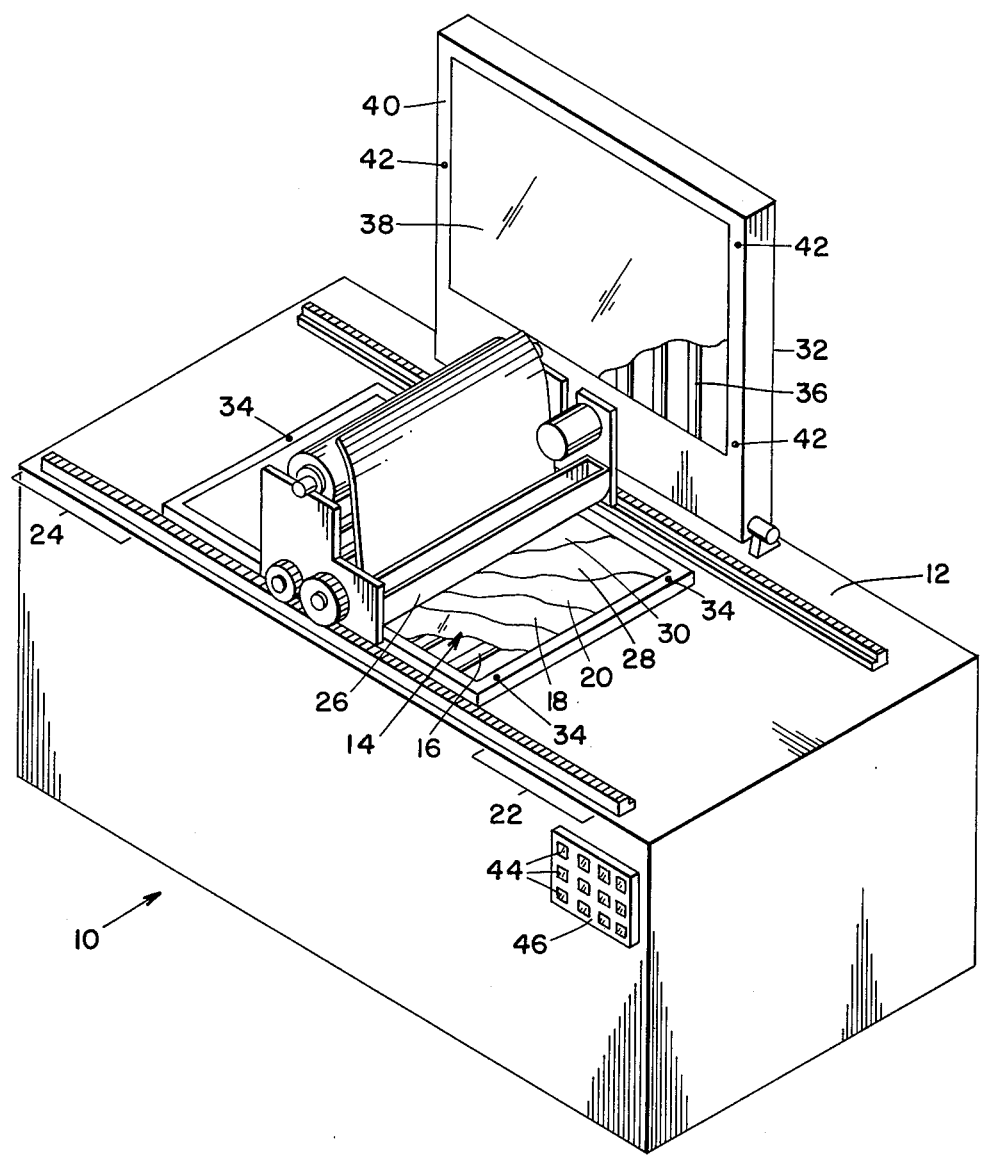

DOCKING SENSOR SYSTEM

SUMMARY OF THE INVENTION

The present invention relates to an improved apparatus for the preparation of photopolymerized relief image plates. More particularly, the present invention relates to an apparatus for the preparation of photopolymerized relief image plates in which a series of indicators are used to detect when a top cover is in position over a layer of liquid photopolymerizable material.

BACKGROUND OF THE INVENTION

Traditionally, relief image plates such as those for printing presses and the like, were produced by hand and were set with movable type. This method later gave way to automatic machines, such as linotypes. In recent years, printing systems have been introduced which produce relief image plates directly from photohardenable material. By exposing such a material to actinic light through a negative image, a selective hardening is obtained which can be used as a printing surface.

Most commonly, the material used for such plates is a photopolymerizable resin. This resin must be spread in an even and uniform layer on a surface on which a negative image has been positioned. Since these resins typically have a high viscosity, it is difficult to provide an even and uniform layer in a short period of time. The longer the preparation requires, the greater the cost of the finished plate to the customer.

Most commonly, a layer of photopolymerizable material is applied by depositing a quantity of material on the platemaking surface and then spreading the material by drawing a doctor blade or nip roller along the surface.

Various mechanisms have been employed in order to assist in providing a more uniform layer of the viscous liquid photopolymer. One method which has served to assist in assuring uniform thickness in the photopolymer layer, as well as controlling the overall thickness of the layer, has been a weighted top cover. This cover is brought into position over the resin layer, released and allowed to settle on the resin layer until it comes to rest on spacing members arrayed around the platemaking surface. These spacing members hold the cover above the surface at a distance which will allow for the desired thickness of the relief image plate. This operation, which equalizes any remaining thickness irregularities in the resin layer as it assures desired thickness, is referred to as docking, since the cover actually floats on the resin layer until it comes to rest on the spacing members. It should be apparent that such a top cover could alternatively be under the influence of any uniform downward force other than gravity, or in addition to gravity, although the force of gravity is normally the preferred method and the top cover is normally weighted for that reason. Likewise, all of the directions as used herein are chosen so as to take advantage of the force of gravity on the liquid polymer system. Alternatively, the platemaking system could be oriented in a vertical plane if some means were introduced to compensate for the effects of gravity.

The operation of a weighted top cover has proven very useful in assisting to efficiently provide useful relief image plates. However, the preparation of plates by this method has taken more time than necessary because, until the present invention, a process operator would not expose the photopolymer to actinic radiation until he believed the cover had docked. The operator has to estimate the time required for docking on the basis of any number of variables, including his experience, the viscosity of the photopolymer and the thickness of the resin. If the cover had not docked in the time estimated by the operator, an unusable plate would result. On the other hand, if the operator overestimated the time required, it would result in a usable plate at the expense of a slight delay. Thus, the operator was inclined to overestimate the time required. In terms of the number of plates prepared in this manner, consistent overestimation of the necessary docking time has resulted in increased cost of operation.

Another occasional problem occurs when too much or too little photopolymerizable resin is deposited on the platemaking surface. When too little resin is deposited, there is at present a needless delay prior to exposure while the operator waits for the cover to dock. But this delay represents only a minor cost factor in this circumstance. In such a circumstance, a plate made by exposure of a layer with too little photopolymer is normally unusable. Additional costs would be incurred for the additional process time required for exposure of the photopolymer, washing out the unexposed material and examination of the plate, as well as the cost of the polymer itself. Often this problem would not be discovered until the plate was examined after washing, and several other unusable plates might have been exposed before the necessary machine adjustments could be made.

When too much photopolymer has been deposited, a result of a similar nature obtains. When the cover has not docked by the time the operator exposes the photopolymer, it is likely that the resulting plate will vary in thickness and be unusable. This will result in costs and delays similar to those set out above.

OBJECTS OF THE PRESENT INVENTION

It is an object of the present invention to provide in an apparatus for the preparation of a photopolymerized relief image plate, which apparatus has a top cover under the effect of a uniform downward force, a means for ascertaining when the top cover is in position for exposure.

It is a further object of the present invention to provide in an apparatus for the preparation of a photopolymerized relief image plate, which apparatus has a top cover under the effect of uniform downward force, a means for ascertaining whether a sufficient amount of photopolymerizable resin has been used to provide a usable relief image plate.

The other objects, features, and advantages of the present invention are pointed out with particularity in the claims annexed to this specification. Further, they will become more apparent in light of the following detailed description of the preferred embodiment thereof and as illustrated in the accompanying drawings.

According to the present invention, there is provided in an apparatus for the preparation of a photopolymerized relief image plate from liquid photopolymerizable material having a horizontal surface which has a transparent platemaking area disposed above an actinic light source and upon which area a negative of the image to be printed may be positioned, means to provide at least one layer of liquid photopolymerizable material over a negative positioned on the platemaking area of said surface, a top cover under the effect of a uniform downward force which can be positioned over the layer of photopolymerizable material, at least three nonaligned spacing members disposed around the platemaking area of the horizontal surface which will support the top cover at a preselected distance above the surface, wherein the improvement comprises means to determine when the top cover is in position on the spacing members over the horizontal surface such that there is defined between said surface and said top cover a uniform space of the desired thickness dimension for the finished relief image plate.

In another embodiment, there is provided in an apparatus for the preparation of a photopolymerized relief image plate from liquid photopolymerizable material having a horizontal surface which has a transparent platemaking area disposed above an actinic light source and upon which area a negative of the image to be printed may be positioned, means to provide at least one layer of liquid photopolymerizable material over a negative positioned on the platemaking area of said surface, a top cover under the effect of a uniform downward force which can be positioned over the layer of photopolymerizable material, at least three nonaligned spacing members disposed around the platemaking area of the horizontal surface which will support the top cover at a preselected distance above the surface, in which the improvement comprises at least three nonaligned electrically conductive elements, each such element located at the upper periphery of one of the spacing members, at least three nonaligned electrically conductive elements disposed on the bottom surface of the top cover so that each is paired with and will make electrical contact with a mating electrically conductive element located on the upper periphery of one of said spacing members when the top cover is supported by said spacing members, and at least three electrically energized indicator circuits, each of which will be closed when the element to which the circuit connects on the bottom surface of the top cover and the mating element to which the circuit connects on one of the spacing members meet and are in electrical contact.

BRIEF DESCRIPTION OF THE FIGURE

The FIGURE shows a view of an apparatus of the present invention.

DETAILED DESCRIPTION OF THE PRESENT INVENTION

An apparatus embodying the improvement of the present invention is shown in the drawing. The apparatus indicated generally as (10) consists of a horizontal surface (12) having a transparent platemaking area (14) over a source of actinic light (16). In order to provide the selective polymerization necessary in the finished relief image plate, a negative of the image to be printed, represented as (18) is positioned on the transparent platemaking area (14). It is then advantageous to provide a sheet of thin transparent film (20) over the negative (18).

When the platemaking area has been thus prepared, a uniform layer of a photopolymerizable material, such as disclosed in U.S. Pat. Nos. 3,556,791 or 3,628,963 or numerous other references, is deposited on the platemaking area. This layer may be provided by any suitable method, such as the bottom opening bucket shown in U.S. Pat. No. 4,056,423. This bucket, or other devices known to the art, will provide a layer of photopolymerizable material by first moving along the platemaking surface from rest in the position shown as (22) to the position (24) and then moving back to the rest position (22) while discharging a regulated amount of photopolymerizable polymer.

The bottom opening bucket of U.S. Pat. No. 4,056,423 is shown generally as (26) in the drawing. As depicted therein, the bucket (26) is returning from its staging position (24) to its rest position (22) During its travel, the bucket deposits an essentially uniform layer of photopolymerizable material, shown as (28) in the drawing.

A second sheet of film may advantageously be provided over the polymer layer, as shown in U.S. Pat. No. 3,837,887 to Akamatsu et al. This sheet (30) may also remain as a substrate in the finished relief image plate.

When the polymer layer (28) is deposited over the platemaking area (14) of the horizontal surface (12), the bucket (26) will have traveled to its rest position (22), which position is removed from the platemaking area (14). At this time, a top cover (32) is lowered down onto the elements assembled on the platemaking area (14). Most advantageously, this cover has substantial weight and the force of gravity will cause the weight of the cover (32) to displace any localized irregularities in the fluid photopolymer layer (28). In practice, the weighted top cover (32) is released from restriction and allowed to float on the fluid photopolymer layer (28). If no further restriction were imposed, the weight of the top cover (32) would eventually displace enough of the fluid photopolymer from the platemaking area (14) to make platemaking impossible. To prevent this, a number of spacing members (34) are arranged around the platemaking area (14). These spacing members (34) are set so as to prevent the weighted top cover (32) from settling down any closer than a predetermined distance to the platemaking area (14). It is advantageous to provide that these be adjustable in order that plates of different thickness may be prepared. When the top cover (32) has settled on these spacing members (34), or docked, the assembly is prepared for exposure to a measured amount of actinic radiation.

In practice, it is advantageous to provide these spacing members (34) in the form of two linear shims extending the length of the platemaking surface on either side. As such, the shims can be seen to represent at least three nonaligned contact points so long as at least one of any three contact points is located on each linear shim. Such shims are advantageous from the standpoint of supporting the weight of the top cover most uniformly. However, they are not required for the complete description of the operation of the present invention and the term "at least three nonaligned spacing members" will be used herein, although three such members would clearly be embodied in two such linear shims.

It may also be desirable to back-expose the photopolymer to a measured amount of uniform radiation, and this may be done by providing the top cover with an actinic light source (36) behind a transparent portion (38) of the bottom surface (40) of the top cover (32), corresponding to the platemaking area (14). Of course, for this back exposure to be effective, any protective film (30) applied over the photopolymer layer (28) must be transparent to the actinic radiation.

Any type of sensing indicator, such as pressure transducers or the like, may be used to detect when the top cover has settled to the desired position. In the preferred embodiment of the present invention, the bottom surface (40) of the top cover (32) is provided with electrically conductive elements (42). These elements are arranged around the transparent portion (38) of the bottom surface (40) at points which correspond to the spacing members (34). It is intended that each of these electrically conductive elements (42) will mate with and contact a spacing member (34), when the top cover (32) has docked. Electrically conductive elements are also positioned on the upper periphery of these spacing members (34), or each spacing member itself is made of an electrically conductive material. Each pair of mating elements, one conductive member (42) on the bottom surface (40) of the top cover (32) and one conductive element on the upper periphery of a spacing member (34), are interconnected by an electrically energized indicator circuit which is closed when the two elements meet and are held in electrical contact by the weight of the top cover (32).

Although the electrically conductive elements (42) are most conveniently placed on the spacing members (34), it should be noted that this is not required. The electrically conductive elements, or any other type of indicator used, may be placed at other positions if desired. Further, it is not required that the number of electrically conductive elements equal the number of spacing members. At least three nonaligned indicators or at least three nonaligned spacing members are required to define a plane, and it is most advantageous to combine the indicators and spacing members to help insure that the plane defined by each coincides. However, a greater number of either indicators or spacing members could be employed without departing from the principle of the present invention.

In operation, each of these indicator circuits may light an indicator light (44) on the operator's control panel (46). When each of the circuits has closed, and each of the indicator lights (44) on the operator's control panel (46) is lit, the top cover (32) has docked and the operator can begin the exposure sequence which will polymerize the photopolymeric layer (28).

Alternatively, the indicator circuits may be linked directly into the controls for the exposure sequence, and both the lower actinic light source (16) and the upper actinic light source (36) may be activated for preselected intervals after all of the indicator circuits have closed.

An added advantage of the present invention is that it may be useful to indicate to the operator if the proper amount of photopolymer has been deposited to produce a usable plate. Measuring the time required for docking will indicate to the operator whether the photopolymer should be increased or decreased in preparing successive plates, and even whether a usable plate will result from exposure of the present assembly. If the measured docking time has been too short, on the basis of such variables as the operator's experience with the viscosity of the resin and the thickness of the plate, the exposure can be aborted and the resin can be reclaimed. Corrective action, such as increasing the amount of resin deposited to cast the next plate can then be taken.

If the measured docking time has been too long, a usable plate will still result if the top cover (32) is allowed additional time to dock and the present invention will allow the operator to wait until such docking actually occurs. However, the amount of resin deposited to cast the next plate may be decreased, to prevent waste of photopolymer resin and valuable machine time.

As an illustration, if experience has taught that the docking time required for a usable plate of given dimension should be on the order of twenty (20) seconds, a docking time of fifteen (15) seconds or less might be considered much too quick. This could indicate that too little photopolymerizable material had been used in preparing the plate. In such a case, corrective action should be taken to save time and avoid wasting materials. This could be done by aborting the exposure sequence, reclaiming the resin and increasing the amount of photopolymerizable material used to form the photopolymerizable layer for the next plate.

In the same illustration, a docking of thirty (30) seconds might be considered too lengthy. Since the top cover has docked, exposure should result in a usable plate. However, it would be advisable in such circumstances to slightly reduce the amount of photopolymerizable material used to form the photopolymerizable layer for the next plate.

Continuing with the same illustration, it may occur that although docking was expected in twenty (20) seconds, after a substantial period of time, say sixty (60) seconds, no docking has occurred. In such a circumstance, it might be prudent to abort the exposure sequence and make an examination to determine why docking was so delayed. While the problem may involve the use of too much photopolymerizable material, some unnoticed irregularity such as a fold in the substrate film or the like may have prevented timely docking. Thus, correction of such a problem can be made without the expense of producing an unusable plate.

In this manner also the docking sensors can be used to prevent other problems, one of which occurs when liquid photopolymerizable material seeps beyond the protective film (20) and protective film substrate (30) and is exposed to actinic radiation. The resulting polymerization bonds the top cover (32) to the horizontal surface (12). This causes extensive delay for cleaning and repair during which the equipment is out of service. By fixing a cut-off point at which the exposure would be aborted if docking is delayed too long, this type of problem is abrogated somewhat.

Other features, advantages and specific embodiments of this invention will become readily apparent to those exercising ordinary skill in the art after reading the foregoing disclosures. These specific embodiments are within the scope of the claimed subject matter unless otherwise expressly indicated to the contrary. Moreover, while a specific embodiment of this invention has been described in considerable detail, variations and modifications of these embodiments can be effected without departing from the spirit and scope of the invention as disclosed and claimed.

What I claim and desire to protect by Letters Patent is:

1. In an apparatus for the preparation of a photopolymerized relief image plate from liquid photopolymerizable material having
    a horizontal surface which has a transparent platemaking area disposed above an actinic light source and upon which area a negative of the image to be printed may be positioned,
    means to provide at least one layer of liquid photopolymerizable material over a negative positioned on the platemaking area of said surface,
    a top cover under the effect of a uniform downward force, which top cover can float on the at least one layer of photopolymerizable material,
    at least three nonaligned spacing members disposed around the platemaking area of the horizontal surface which will support the top cover at a preselected distance above the surface, wherein the improvement comprises at least three nonaligned electrically conductive elements, each such element located at the upper periphery of one of the spacing members, at least three nonaligned electrically conductive elements disposed on the bottom surface of the top cover so that each is paired with and will make electrical contact with a mating electrically conductive element located on the upper periphery of one of said spacing members when the top cover is supported by said spacing members, and at least three electrically energized indicator circuits, each of which will be closed when the element to which the circuit connects on the bottom surface of the top cover and the mating element to which the circuit connects on one of the spacing members meet and are in electrical contact.

2. In an apparatus for the preparaion of a photopolymerized relief image plate from liquid photopolymerizable material having a horizontal surface which has a platemaking area disposed below an actinic light source, means to provide at least one layer of liquid photopolymerizable material on the platemaking area of said surface, upon which layer a negative of the image to be printed may be positioned, a transparent top cover under the effect of a uniform downward force, which top cover can float on the at least one layer of photopolymerizable material and negative, at least three nonaligned spacing members disposed around the platemaking area of the horizontal surface which will support the top cover at a preselected distance above the horizontal surface, wherein the improvement comprises at least three nonaligned electrically conductive elements, each such element located at the upper periphery of one of the spacing members, at least three nonaligned electrically conductive elements disposed on the bottom surface of the top cover so that each is paired with and will make electrical contact with a mating electrically conductive element located on the upper periphery of one of said spacing members when the top cover is supported by said spacing members, and at least three electrically energized indicator circuits, each of which will be closed when the element to which the circuit connects on the bottom surface of the top cover and the mating element to which the circuit connects on one of the spacing members meet and are in electrical contact.

3. In an apparatus for the preparation of a photopolymerized relief image plate from liquid photopolymerizable material having a horizontal surface which has a transparent platemaking area disposed between two actinic light sources, means to provide upon said platemaking area both a negative of the image to be printed and at least one layer of liquid photopolymerizable material, a transparent top cover under the effect of a uniform downward force, which top cover can float on the negative and the at least one layer of photopolymerizable material, at least three nonaligned spacing members disposed around the platemaking area of the horizontal surface which will support the top cover at a preselected distance above the horizontal surface, wherein the improvement comprises at least three nonaligned electrically conductive elements, each such element located at the upper periphery of one of the spacing members, at least three nonaligned electrically conductive elements disposed on the bottom surface of the top cover so that each is paired with and will make electrical contact with a mating electrically conductive element located on he upper periphery of one of said spacing members when the top cover is supported by said spacing members, and at least three electrically energized indicator circuits, each of which will be closed when the element to which the circuit connects on the bottom surface of the top cover and the mating element to which the circuit connects on one of the spacing members meet and are in electrical contact.

* * * * *

UNITED STATES PATENT AND TRADEMARK OFFICE
CERTIFICATE OF CORRECTION

PATENT NO. : 4,475,810
DATED : October 9, 1984
INVENTOR(S) : Richard E. Schroeder It is certified that error appears in the above-identified patent and that said Letters Patent are hereby corrected as shown below:

Column 7, Claim 2, line 20;

"preparaion" should read --preparation-- .

Signed and Sealed this

Nineteenth Day of March 1985

[SEAL]

Attest:

DONALD J. QUIGG

*Attesting Officer*      *Acting Commissioner of Patents and Trademarks*